US010096512B2

(12) United States Patent
Chen et al.

(10) Patent No.: US 10,096,512 B2
(45) Date of Patent: Oct. 9, 2018

(54) GAPFILL FILM MODIFICATION FOR ADVANCED CMP AND RECESS FLOW

(71) Applicant: Applied Materials, Inc., Santa Clara, CA (US)

(72) Inventors: Erica Chen, Cupertino, CA (US); Ludovic Godet, Sunnyvale, CA (US); Srinivas D. Nemani, Sunnyvale, CA (US); Ellie Y. Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/290,005

(22) Filed: Oct. 11, 2016

(65) Prior Publication Data
US 2017/0117157 A1  Apr. 27, 2017

Related U.S. Application Data

(60) Provisional application No. 62/245,577, filed on Oct. 23, 2015.

(51) Int. Cl.
*H01L 21/768*  (2006.01)
*H01L 21/3115*  (2006.01)
*H01L 21/265*  (2006.01)
*H01L 21/306*  (2006.01)
*H01L 21/324*  (2006.01)
(Continued)

(52) U.S. Cl.
CPC ...... *H01L 21/76825* (2013.01); *H01L 21/265* (2013.01); *H01L 21/30625* (2013.01); *H01L 21/31051* (2013.01); *H01L 21/31155* (2013.01); *H01L 21/324* (2013.01);
(Continued)

(58) Field of Classification Search
CPC .......... Y10S 438/924; H01L 21/76224; H01L 21/76825; H01L 21/76828
See application file for complete search history.

(56) References Cited

U.S. PATENT DOCUMENTS 7,767,583 B2  8/2010  Ramappa et al.
7,811,891 B2 *  10/2010  Orlowski .......... H01L 21/28114
257/E21.198
(Continued)

FOREIGN PATENT DOCUMENTS

WO  2013/085684 A1  6/2013

OTHER PUBLICATIONS

PCT Notification of Transmittal of the International Search Report and the Written Opinion of the International Searching Authority for International Application No. PCT/US2016/054453; dated Jan. 13, 2017; 10 total pages.

*Primary Examiner* — Julio J Maldonado
*Assistant Examiner* — Evan Clinton
(74) *Attorney, Agent, or Firm* — Patterson + Sheridan, LLP

(57) ABSTRACT

Implementations described herein relate to methods for forming gap fill materials. After the gap fill material is deposited and before a CMP process is performed on the gap fill material, one or more ion implantation processes are utilized to treat the deposited gap fill material. The one or more ion implantation processes include implanting a first ion species in the gap fill material using a first ion energy, and then implanting a second ion species in the gap fill material using a second ion energy that's lower than the first ion energy. The one or more ion implantation processes minimize CMP dishing and improve recess profile.

6 Claims, 7 Drawing Sheets

(51) Int. Cl.
  *H01L 21/762*    (2006.01)
  *H01L 21/3105*   (2006.01)
  *H01L 21/321*    (2006.01)

(52) U.S. Cl.
  CPC .... *H01L 21/3212* (2013.01); *H01L 21/76224* (2013.01); *H01L 21/76828* (2013.01)

(56) References Cited

U.S. PATENT DOCUMENTS

| | | |
|---|---|---|
| 2003/0201468 A1 | 10/2003 | Christiansen et al. |
| 2005/0054182 A1 | 3/2005 | Wang |
| 2007/0141802 A1 | 6/2007 | Gadkaree |
| 2008/0286937 A1 | 11/2008 | Mitani |
| 2009/0020815 A1 | 1/2009 | Godo |
| 2013/0217243 A1* | 8/2013 | Underwood ...... H01L 21/02356 438/783 |
| 2014/0054679 A1* | 2/2014 | Tang ................ H01L 21/26586 257/329 |
| 2014/0080276 A1* | 3/2014 | Brand ............... H01L 29/66803 438/283 |
| 2015/0118822 A1 | 4/2015 | Zhang et al. |
| 2015/0380519 A1* | 12/2015 | Zhao ................ H01L 21/02164 257/410 |
| 2016/0218041 A1* | 7/2016 | Du .................. H01L 21/823481 |
| 2017/0110577 A1* | 4/2017 | Wang ................... H01L 21/265 |

* cited by examiner

GAPFILL FILM MODIFICATION FOR ADVANCED CMP AND RECESS FLOW

CROSS-REFERENCE TO RELATED APPLICATIONS

This application claims priority to U.S. Provisional Patent Application Ser. No. 62/245,577, filed on Oct. 23, 2015, which herein is incorporated by reference.

BACKGROUND

Field

Implementations of the present disclosure generally relate to methods for forming gap fill materials on a substrate. More specifically, implementations provided herein relate to a process flow for forming gap fill materials.

Description of the Related Art

In semiconductor processing, devices are being manufactured with continually decreasing feature dimensions. Often, features utilized to manufacture devices at these advanced technology nodes include high aspect ratio structures and it is often necessary to fill gaps between the high aspect ratio structures with a gap fill material, such as an insulating material. Examples where insulating materials are utilized for gap fill applications include shallow trench isolation (STI), inter-metal dielectric layers (ILD), pre-metal dielectrics (PMD), passivation layers, patterning applications, etc. As device geometries shrink and thermal budgets are reduced, void-free filling of high aspect ratio spaces becomes increasingly difficult due to limitations of existing deposition processes.

Gap fill materials may be deposited by various deposition processes, such as flowable chemical vapor deposition (FCVD), spin-on, atomic layer deposition (ALD), plasma enhanced chemical vapor deposition (PECVD), or low pressure chemical vapor deposition (LPCVD). The as-deposited gap fill materials are usually of poor quality, characterized by high wet etch rate ratio (WERR) and high stress. Subsequent processes, such as curing and/or annealing, are performed to improve the quality of the gap fill materials. Even then, the gap fill materials still face several key challenges such as dishing, caused by chemical mechanical polishing (CMP) processes, and nonplanar recess profile.

Therefore, there is a need for improved processes for forming gap fill materials.

SUMMARY

Implementations of the present disclosure generally relate to methods for forming gap fill materials on a substrate. In one implementation, a method for treating a gap fill material includes implanting a first ion species in the gap fill material using a first ion energy, implanting a second ion species in the gap fill material using a second ion energy, wherein the first ion energy is greater than the second ion energy, annealing the gap fill material after exposure to the second ion species, and performing a chemical mechanical polishing process on the gap fill material, wherein a dishing of the gap fill material is less than 8 nm.

In another implementation, a method for treating a gap fill material includes implanting helium ion species in the gap fill material using a first ion energy, implanting silicon ion species in the gap fill material using a second ion energy, wherein the first ion energy is greater than the second ion energy, annealing the gap fill material after exposure to the silicon ion species, and performing a chemical mechanical polishing process on the annealed gap fill material.

In another implementation, a method for forming a gap fill material includes depositing a gap fill material on a substrate and treating the gap fill material. The treating includes implanting helium ion species in the gap fill material using a first ion energy and implanting silicon ion species in the gap fill material using a second ion energy, wherein the first ion energy is greater than the second ion energy. The method further includes annealing the gap fill material after exposure to the silicon ion species to form an annealed gap fill material, and performing a chemical mechanical polishing process on the annealed gap fill material.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only exemplary implementations and are therefore not to be considered limiting of its scope, may admit to other equally effective implementations.

Figure 1:
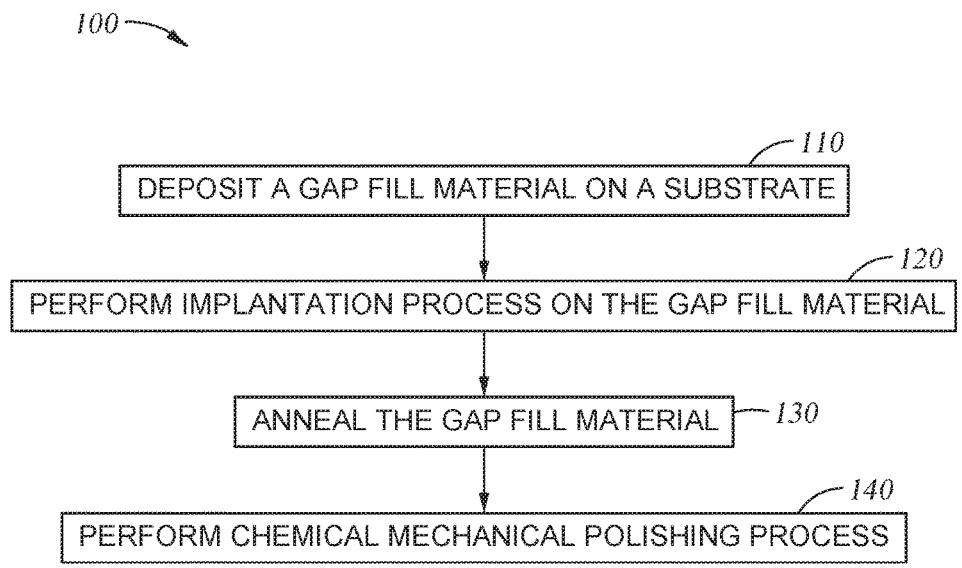
FIG. 1 illustrates a method for forming a gap fill material on a substrate according to one implementation described herein.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Implementations described herein relate to methods for forming gap fill materials. After the gap fill material is deposited and before a CMP process is performed on the gap fill material, one or more ion implantation processes are utilized to treat the deposited gap fill material. The one or more ion implantation processes include implanting a first ion species in the gap fill material using a first ion energy, and then implanting a second ion species in the gap fill material using a second ion energy that is lower than the first ion energy. The one or more ion implantation processes minimize CMP dishing and improve recess profile.

FIG. 1 illustrates a method 100 for forming a gap fill material on a substrate according to one implementation described herein. At block 110, a gap fill material is deposited on a substrate. The substrate generally has features formed thereon and one or more processing chambers may be utilized to deposit the gap fill material between the features on the substrate. The gap fill material may be deposited by any suitable process, such as FVCD, Spin-on, ALD, PECVD, or LPCVD. The gap fill material may be any suitable material, such as a dielectric material. In one implementation, a plurality of fins are formed spaced apart on the substrate, and the gap fill material, or shallow trench isolation (STI) structure, is deposited between the fins on the substrate. The STI structures may be formed by an insulating material, such as silicon dioxide. In another implementation, the gap fill material may be the interlevel dielectric (ILD) layer deposited between a plurality of polycrystalline silicon gates, and the ILD layer may be formed by silicon dioxide.

The gap fill material, such as the STI structure or the ILD layer, may be cured subsequent to the deposition process to remove moisture and residual organics, harden and densify the material. The curing is typically performed using low temperature processes at a temperature of about 100 degrees Celsius or less. Such processes include exposure to inductively coupled plasma, ultraviolet light, ozone, e-beam, acidic or basic vapors, an aqueous environment such as heated deionized water, and a combination or succession of such treatments.

Next, at block 120, one or more ion implantation processes may be performed on the gap fill material. The as deposited and cured gap fill material may have high WERR and high stress, along with dishing issue caused by subsequent CMP process and nonplanar recess profile. Dishing is defined by the difference in height between the lowest point of the gap fill material and the highest point of the gap fill material at the end of the CMP process. The nonplanar surface caused by the dishing issue may be aggravated by the subsequent recess process or wet/soft clean process. The recess process is a removal process, such as an etching process performed on the gap fill material. In order to reduce WERR, stress, and dishing, the gap fill material may be treated by one or more ion implantation processes.

Figure 2A:
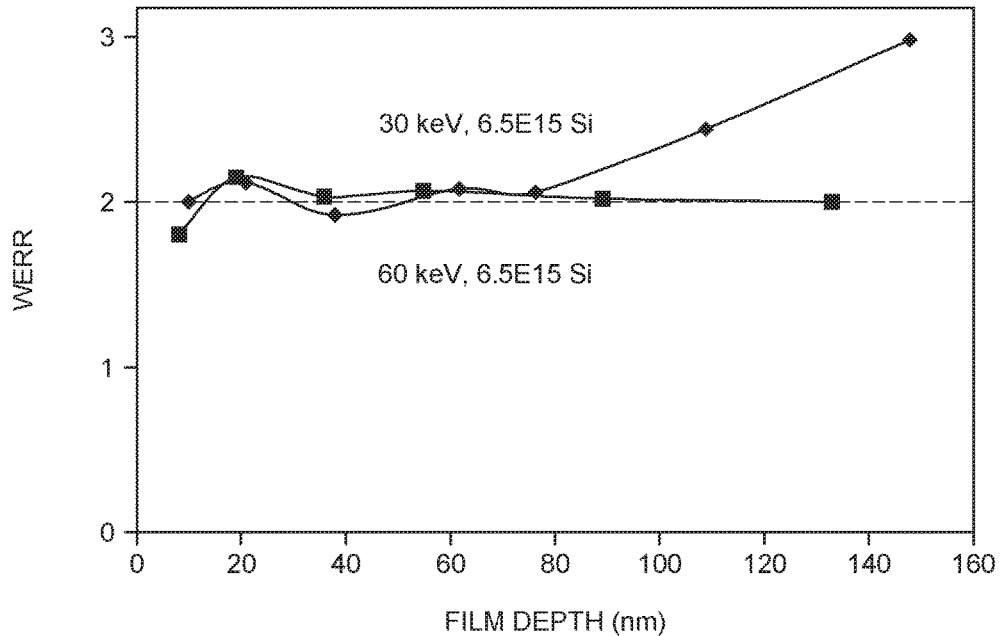
FIGS. 2A-2B are charts illustrating effects of ion implantation on wet etch rate ratio according to implementations described herein.
Figure 2B:
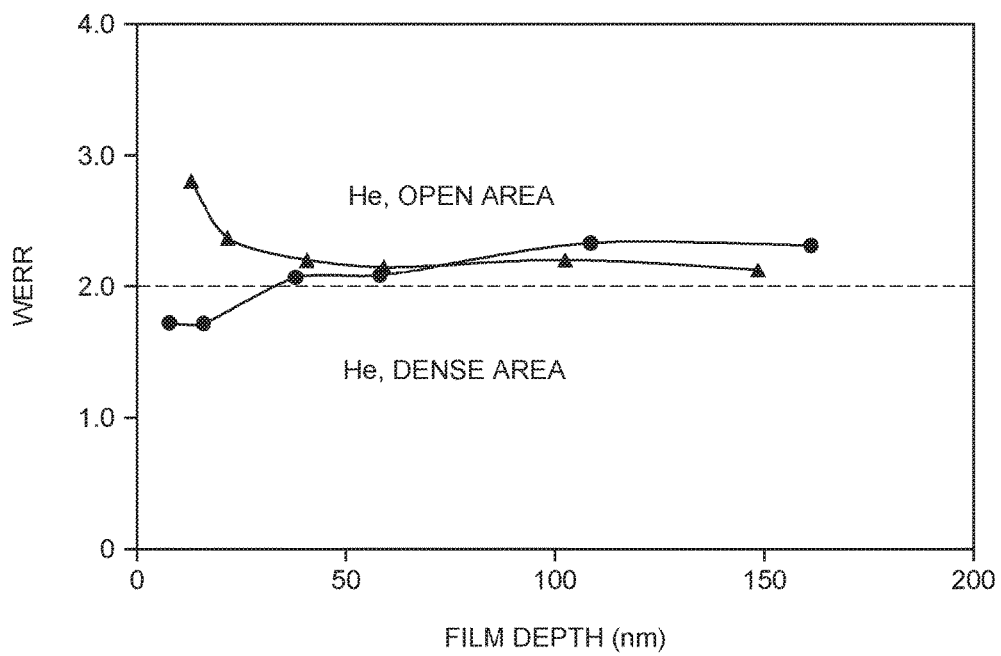

The one or more ion implantation processes generally incorporate ion species into the gap fill material to break bonds in the gap fill material. As a result, reactivity and conversion of the gap fill material during the subsequent annealing process are increased. The one or more ion implantation processes also improves the WERR of the gap fill material. FIGS. 2A-2B are charts illustrating effects of ion implantation on WERR according to implementations described herein. In one implementation, silicon ion species are implanted into the gap fill material. FIG. 2A shows a chart illustrating the effect of ion energy on WERR. As shown in FIG. 2A, low WERR, such as 2, is achieved at an implantation depth of 100 nm of shallower for both ion energy levels. However, in order to achieve low WERR deeper into the gap fill material, such as greater than 100 nm, higher ion energy, such as 60 keV, may be used compared to lower ion energy, such as 30 keV.

In another implementation, helium ion species are implanted into the gap fill material. FIG. 2B shows a chart illustrating the effect of ion energy on WERR. As shown in FIG. 2B, WERR remains low for gap fill material implanted with helium ion species in both dense and open areas. Dense area is referred to relatively more features located within a specific area, and open area is referred to relatively less features located within a specific area.

Figure 3A:
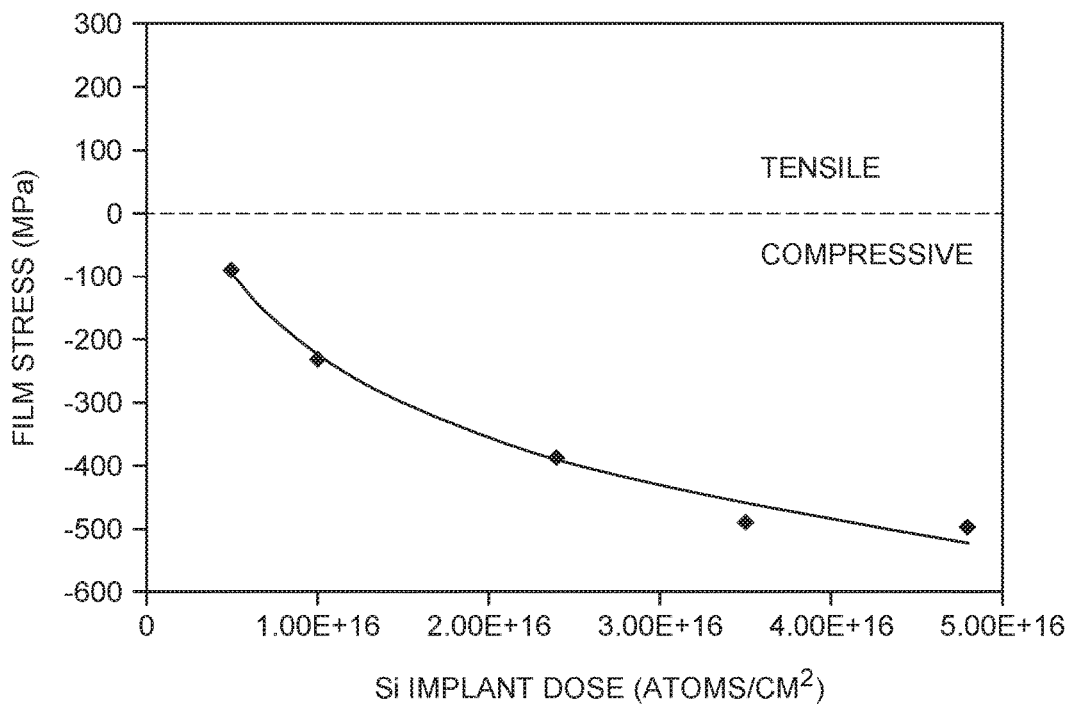
FIGS. 3A-3B are charts illustrating effects of ion implantation on film stress according to implementations described herein.
Figure 3B:
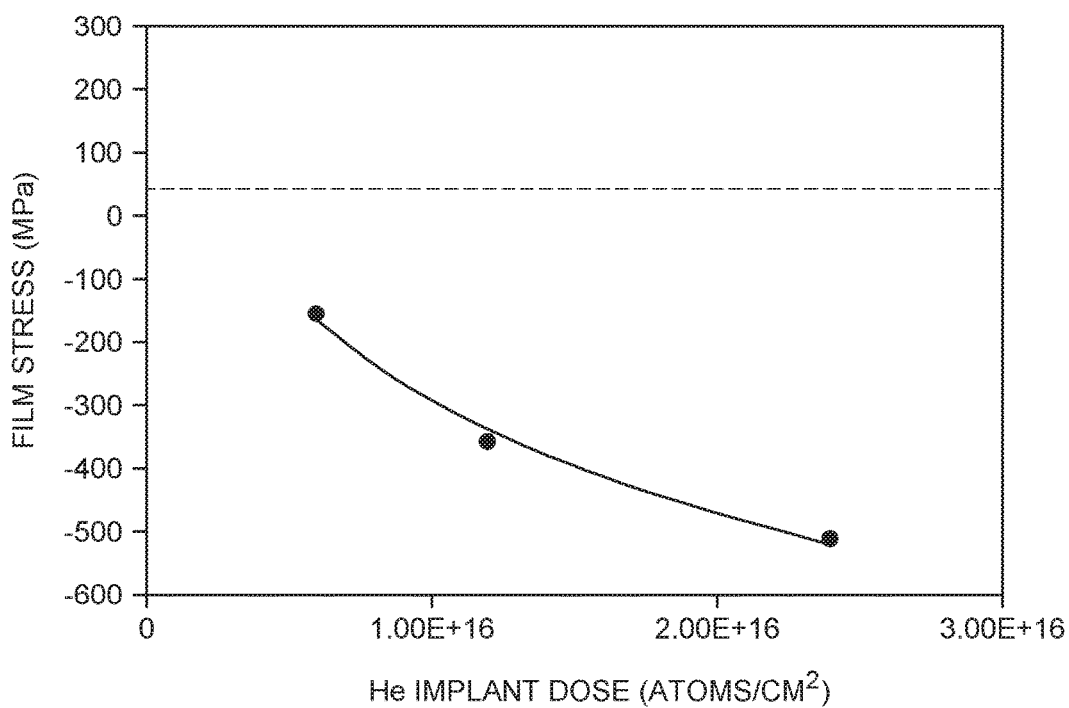

FIGS. 3A-3B are charts illustrating effects of ion implantation on film stress according to implementations described herein. As shown in FIGS. 3A and 3B, for both Si and He ion species, the film stress, or the stress of the gap fill material, becomes more compressive as implant dosage increases. The implant dosage may range from about $1\times10^{15}$ to about $5\times10^{17}$ atoms per $cm^2$.

Figure 4A:
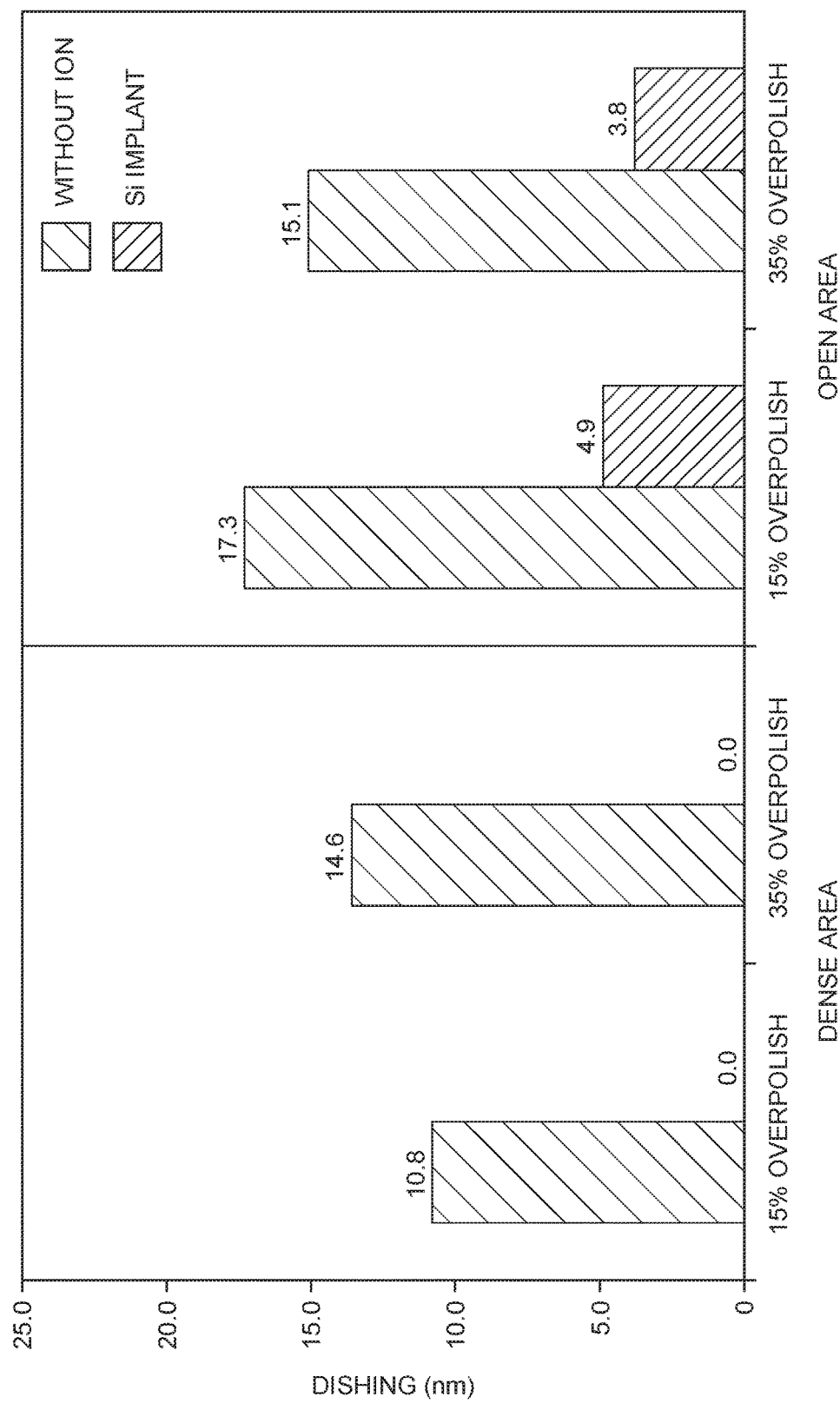
FIGS. 4A-4C are charts illustrating effects of ion implantation on dishing according to implementations described herein.
Figure 4B:
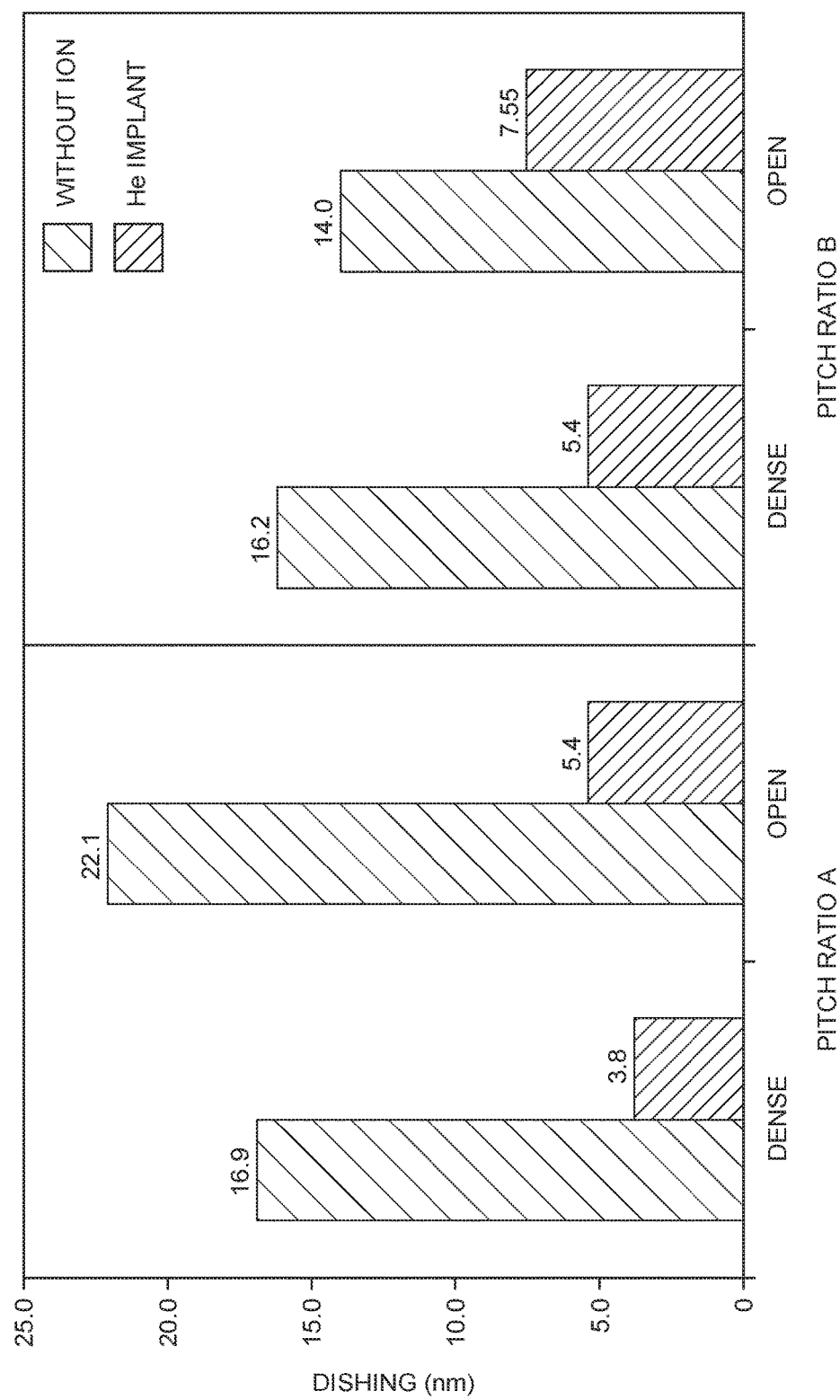
Figure 4C:
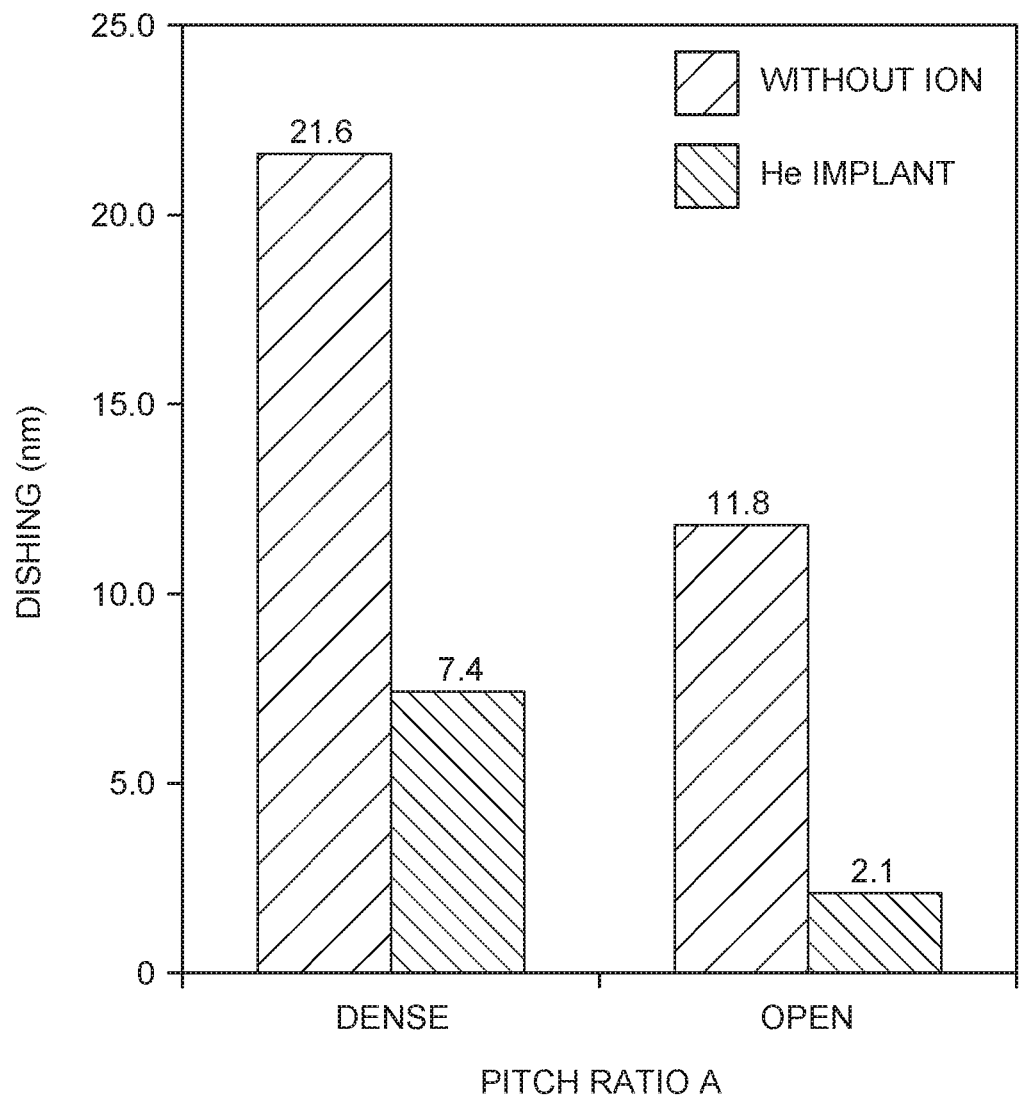

FIGS. 4A-4C are charts illustrating effects of ion implantation on dishing according to implementations described herein. As described above, dishing may occur after the subsequent CMP process, and dishing is defined by the difference in height (nm) between the lowest point of the gap fill material and the highest point of the gap fill material at the end of the CMP process. FIG. 4A illustrates reduced dishing with silicon ion species implanted in the gap fill material compared to without silicon ion species implantation. As shown in FIG. 4A, in a dense area, gap fill material that is 15% or 35% overpolished during the CMP process has a dishing of 0 nm when silicon ion species are implanted in the gap fill material prior to the CMP process. Similarly, in an open area, gap fill material that is 15% or 35% overpolished during the CMP process has a dishing of less than 5 nm when silicon ion species are implanted in the gap fill material prior to the CMP process.

FIG. 4B also illustrates reduced dishing with helium ion species implanted in the gap fill material compared to without helium ion species implantation. As shown in FIG. 4B, for gap fill material in features having a pitch ratio A and features having a pitch ratio B, the dishing is much lower for the gap fill material that has been implanted with helium ion species compared to without helium ion species implantation in both dense and open areas. FIG. 4C is a chart illustrating dishing at the end of a recess process following the CMP process. As shown in FIG. 4C, dishing is reduced with helium ion species implanted in the gap fill materials in both dense and open areas. As shown in FIGS. 4A-4C, dishing of the gap fill material following the CMP process or recess process is less than about 8 nm when one or more ion implantation process is performed on the gap fill material prior to the CMP and recess processes.

Figure 5:
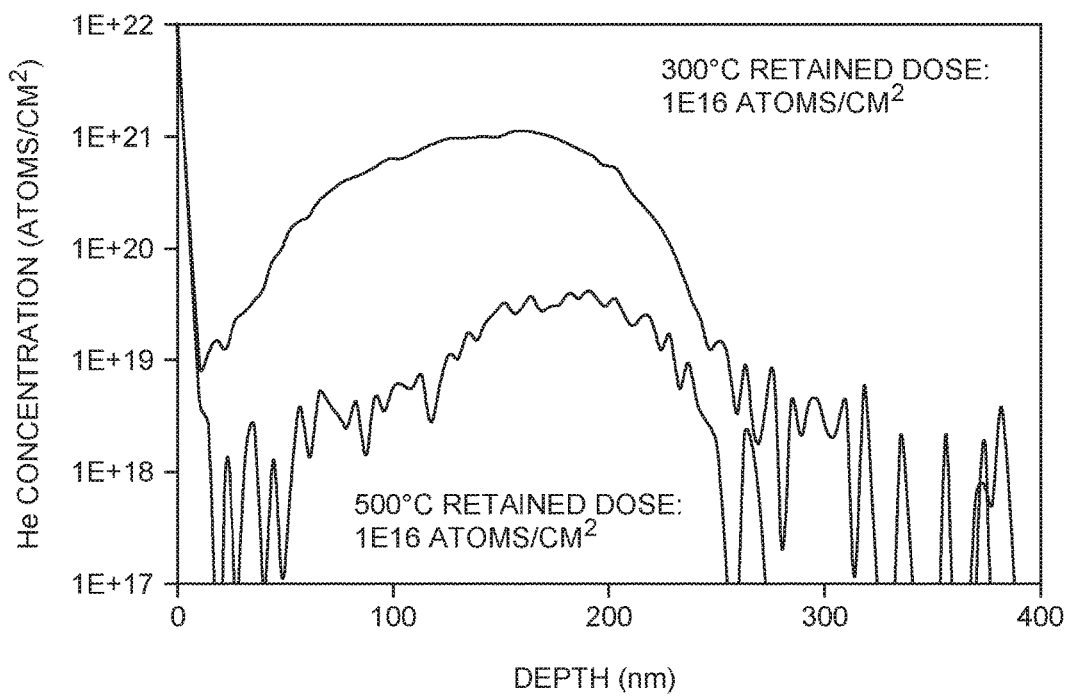
FIG. 5 is a chart illustrating effects of ion implantation on ion concentration at different temperatures according to implementations described herein.

The one or more ion implantation processes may be performed at any suitable temperatures, ranging from below 0 degrees Celsius to about 500 degrees Celsius. In some implementations, in order to minimize damage to the gap fill material, ion species are implanted at a temperature of greater than 450 degrees Celsius, such as about 500 degrees Celsius. It has been found that when implantation temperature is greater than 450 degrees Celsius, the ion species accumulation in the gap fill material is reduced, which leads to less damage to the gap fill material. FIG. 5 is a chart illustrating effects of ion implantation on ion concentration at different temperatures according to implementations described herein. As shown in FIG. 5, the concentration of the helium ion species in the gap fill material is lower when the ion implantation process is performed at 500 degrees Celsius compared to the ion implantation process performed at 300 degrees Celsius. Again, lower concentration of implanted ion species minimizes damage to the gap fill material. Thus, in some implementations, the one or more ion implantation processes are performed at a temperature greater than 450 degrees Celsius, such as 500 degrees Celsius.

The ion species implanted in the gap fill material may be any suitable ion species, such as silicon ion species, helium ion species, hydrogen ion species, nitrogen ion species, or other inert ion species, such as argon ion species. In some implementations, small sized ion species, such as helium ion species, are implanted in the gap fill material in order to minimize damage to the gap fill material. However, as shown in FIGS. 4A-4C, gap fill material implanted with silicon ion species shows improved dishing over gap fill material implanted with helium ion species. Thus, in some implementations, more than one ion implantation processes are performed to treat the gap fill material.

Figure 6:
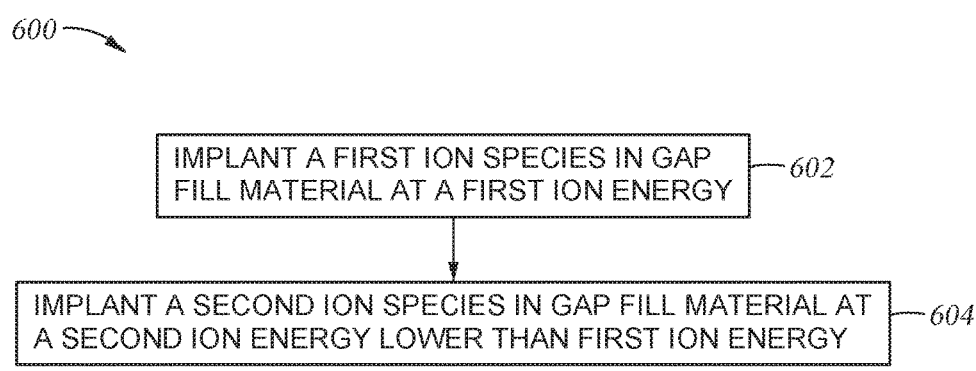
FIG. 6 illustrates a method for treating the gap fill material on a substrate according to one implementation described herein.

FIG. 6 illustrates a method 600 for treating the gap fill material on a substrate according to one implementation described herein. At block 602, a first ion species are implanted in the gap fill material at a first ion energy. In one implementation, the first ion species are helium ion species. At the first ion energy, the first ion species are implanted in the gap fill material at a first depth. At block 604, a second ion species are implanted in the gap fill material at a second ion energy. In one implementation, the second ion species are silicon ion species and the second ion energy is less than the first ion energy. With lower ion energy, the silicon ion species are implanted in the gap fill material at a second depth that is shallower than the first depth. As a result, following the subsequent CMP process, dishing is improved since gap fill material implanted with silicon ion species shows a better result in dishing compared to gap fill material implanted with helium ion species. The depths of the first and second ion species may be determined by the amount of gap fill material to be removed by the CMP process. The first and second ion species may be any suitable ion species, such as silicon ion species, helium ion species, hydrogen ion species, nitrogen ion species, or other inert ion species, such as argon ion species. In some implementations, the first ion species are the same as the second ion species. The two implantation processes of the same ion species help to improve the uniformity of the implanted ion species.

Referring back to FIG. 1, at block 130, following the one or more ion implantation processes, the gap fill material may be annealed. Annealing of the gap fill material may be performed either in the deposition chamber, the ion implantation chamber, or a different annealing apparatus, such as a rapid thermal processing chamber. The annealing process may be performed at a temperature of about 500 degree Celsius. Water vapor may be provided during the annealing process to steam anneal the gap fill material. In one implementation, the gap fill material is silicon dioxide. It is believed that oxygen atoms in the steam may advantageously be incorporated into the silicon dioxide gap fill material by bonding to Si dangling bonds and increase the oxygen content of the silicon dioxide material. It is contemplated that the steam annealing process may also prevent shrinkage of the silicon dioxide material due to the availability of oxygen atoms for increased Si—O bonding.

Following the annealing process, a CMP process is performed on the gap fill material, as shown in block 140. As described before, dishing caused by the CMP process is minimized by the addition of the one or more ion implantation processes in the process flow.

While the foregoing is directed to implementations of the present disclosure, other and further implementations of the disclosure may be devised without departing from the basic scope thereof, and the scope thereof is determined by the claims that follow.

The invention claimed is:

1. A method for forming a gap fill material, comprising:
depositing a gap fill material on a substrate;
treating the gap fill material, the treating comprising:
   implanting helium ions in the gap fill material using a first ion energy; and then
   implanting silicon ions in the gap fill material using a second ion energy, wherein the first ion energy is greater than the second ion energy; then
annealing the gap fill material after implanting the silicon ion species to form an annealed gap fill material; and then
performing a chemical mechanical polishing process on the annealed gap fill material.

2. The method of claim 1, wherein the annealing the gap fill material is performed at about 500 degrees Celsius.

3. The method of claim 2, wherein the annealing the gap fill material comprises steam annealing.

4. The method of claim 1, wherein the helium ion species are implanted in the gap fill material at a first depth.

5. The method of claim 4, wherein the silicon ion species are implanted in the gap fill material at a second depth, wherein the second depth is shallower than the first depth.

6. The method of claim 1, wherein the helium ion species are implanted at a temperature greater than 450 degrees Celsius.

* * * * *